United States Patent [19]

Vanwert et al.

[11] Patent Number: 5,270,425
[45] Date of Patent: Dec. 14, 1993

[54] ONE-PART CURABLE ORGANOSILOXANE COMPOSITIONS

[75] Inventors: Bernard Vanwert; Steven W. Wilson, both of Midland, Mich.

[73] Assignee: Dow Corning Corporation, Midland, Mich.

[21] Appl. No.: 980,078

[22] Filed: Nov. 23, 1992

[51] Int. Cl.⁵ .............................. C08G 77/06
[52] U.S. Cl. ........................ 528/15; 528/16; 524/730; 524/731
[58] Field of Search ............. 528/15, 16; 524/730, 524/731

[56] References Cited

U.S. PATENT DOCUMENTS

| | | | |
|---|---|---|---|
| 4,087,585 | 5/1978 | Schulz | 428/429 |
| 4,703,074 | 10/1987 | Izutsu et al. | 524/262 |
| 5,082,894 | 1/1992 | Vanwert et al. | 524/730 |

FOREIGN PATENT DOCUMENTS

| | | |
|---|---|---|
| 240333 | 10/1987 | European Pat. Off. |
| 3828098 | 3/1990 | Fed. Rep. of Germany |
| 52-32030 | 3/1977 | Japan |
| 54-1327 | 1/1979 | Japan |
| 57-87402 | 5/1982 | Japan |
| 101146 | 11/1983 | Japan |
| 2-18452 | 1/1990 | Japan |

Primary Examiner—Melvyn I. Marquis
Attorney, Agent, or Firm—Robert Spector

[57] ABSTRACT

One part organosiloxane compositions exhibiting long term storage stability under ambient conditions and adhesion at curing temperatures below 120° C. comprise a specified combination of platinum catalyst inhibitors and an adhesion promoting composition consisting essentially of a vinyltrialkoxysilane, an epoxy-substituted alkoxysilane, a vinyl-containing hydroxylated polyorganosiloxane, and a chelated aluminum compound.

5 Claims, No Drawings

ONE-PART CURABLE ORGANOSILOXANE COMPOSITIONS

BACKGROUND OF THE INVENTION

Field of the Invention

This invention relates to organosiloxane compositions that cure by a platinum-catalyzed hydrosilation reaction. More particularly this invention relates to combinations of additives for one-part organosiloxane compositions that impart both long term storage stability and adhesion to a variety of substrates, including metals and printed circuit boards, that the composition is in contact with during curing without interfering with curing of the composition at temperatures below about 120° C.

The curing characteristics of organosiloxane compositions that cure by a platinum-catalyzed hydrosilation reaction and the properties of the cured materials obtained from these compositions are desirable for a variety of end use applications in the electrical and electronics areas. The cured materials are particularly useful as protective coatings for integrated circuits and other electronic devices and as coatings for printed circuit boards.

A shortcoming of organosiloxane compositions that cure by a hydrosilation reaction is their inability to adhere strongly to many substrates, particularly plastics. One method for overcoming this deficiency is by the use of primer compositions or adhesion promoting additives containing silanes and organosiloxanes with a plurality of silicon-bonded hydrolyzable groups and at least one organofunctional substituent bonded to silicon through at least one carbon atom. Primer compositions are applied to substrates to which adhesion is desired prior to application of the curable organosiloxane composition. Adhesion promoters are an ingredient of the curable organosiloxane composition.

Examples of hydrolyzable groups are alkoxy, carboxy such as acetoxy, ketoximo such as methylethyl ketoximo, and amido. The organofunctional group is typically one that will react with the substrate to which bonding is desired. Examples of suitable organofunctional groups include but are not limited to alkenyl such as vinyl and allyl, aminoalkyl, epoxyalkyl, mercaptoalkyl and (meth)acryloxyalkyl.

Two classes of silanes frequently used as adhesion promoting additives are vinyltrialkoxysilanes and epoxy-functional silanes such as 3-glycidoxypropyltrialkoxysilane. The use of these silanes individually or in combination as ingredients of curable organosiloxane compositions is described in Japanese Laid-Open Applications 57/87402, 54/1327, 52/32030, 2/18452 and West German published application 3,828,098. U.S. Pat. No. 4,703,074 describes polyphenylene sulfide resin compositions containing the combination of a vinyltrialkoxysilane with either an aminosilane or an epoxy-functional silane to improve the moisture resistance and mechanical strength of the resin.

European patent application no. 240,333 describes organic or silicone resin compositions containing up to 100 weight percent, based on the weight of the resin, of particles obtained by curing an organosiloxane composition containing an alkoxy substituted silane such as 3-glycidoxypropyltrimethoxysilane and an aluminum or zirconium compound.

The prior art also teaches using mixtures of two or more organosilicon compounds to achieve cohesive bonding between silicone elastomers cured by a platinum-catalyzed hydrosilation reaction and various substrates while extending the working time of the corresponding curable compositions. The combination of (1) a polyorganosiloxane containing a hydroxy group and a vinyl radical and (2) an epoxy-functional silane is taught in U.S. Pat. No. 4,087,585 that issued to Schulz on May 2, 1978. This patent also discloses the necessity of heating curable compositions containing this adhesion promoter to temperatures of at least 100 degrees C. to overcome the inhibiting effect of the adhesion promoter on the curing reaction.

A disadvantage of many organofunctional organosilicon compounds used as adhesion promoters in prior art compositions, particularly those described in the aforementioned U.S. Pat. No. 4,087,585, is their adverse effect on the cure rate and completeness of cure, particularly at temperatures below about 120° C. Some integrated circuits and other heat-sensitive electronic devices cannot be exposed to temperatures above this limit even for relatively short periods of time without the risk of damage to the device.

U S. Pat. No. 5,082,894, which issued to Vanwert and Houghtaling on Jan. 21, 1992, teaches that the shortcomings of poor storage stability and relatively high curing temperatures associated with the compositions described in the aforementioned U.S. Pat. No. 4,087,585 can be overcome by including in the curable composition as the catalyst inhibitor an acetylenic alcohol containing at least 8 carbon atoms. The compositions described in this patent do not adhere well to metals such as aluminum and stainless steel, and they cannot be cured at temperatures below 100° C.

One objective of this invention is to provide a group of additives that can be incorporated into one-part organosiloxane compositions to achieve long term storage without sacrificing the ability of the composition to cure completely while developing strong adhesion to plastics, glass reinforced plastics and metals during relatively short exposures to temperatures below about 110° C.

A second objective of this invention is to provide a class of curable organosiloxane compositions that can be used as coating materials for heat-sensitive electronic devices and circuit boards containing these devices.

SUMMARY OF THE INVENTION

The present inventors discovered that the adverse effects of the adhesion promoter described in the aforementioned U.S. Pat. Nos. 4,087,585 and 5,082,894 on the storage stability, curing properties and/or adhesion of curable organosiloxane compositions can be eliminated using the combination of an alkenyltrialkoxysilane, an epoxy-substituted alkoxysilane, an alkenyl- and silanol-functional polyorganosiloxane, a chelated aluminum compound and a specified combination of platinum catalyst inhibitors.

DETAILED DESCRIPTION OF THE INVENTION

This invention provides a storage stable organosiloxane composition exhibiting adhesion to both organic and inorganic substrates following curing at temperatures below 120° C., said composition comprising (A) a curable polyorganosiloxane containing at least two alkenyl radicals per molecule, (B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4, (C) an amount sufficient to promote curing of said composition of a hydrosilation catalyst selected from the group consisting of metals from the platinum group of the periodic table and compounds of said metals, (D) an amount sufficient to achieve adhesion to substrates in contact with said composition during curing of an adhesion promoting composition consisting essentially of an epoxy-substituted silane, a alkenyl-substituted silane, an adhesion promoting polyorganosiloxane that is a liquid at 25° C. and contains at least one silicon-bonded alkenyl radical, at least one silicon-bonded hydroxyl group and no more than 15 silicon atoms per molecule, and an amount of chelated aluminum compound sufficient to promote reaction of said adhesion promoting composition, where said epoxy- and alkenyl-substituted silanes contain at least two silicon-bonded hydrolyzable groups per molecule, and (E) an amount sufficient to inhibit curing of said composition under ambient conditions of a platinum catalyst inhibiting composition comprising at least one cyclic methylvinylsiloxane and an acetylenic alcohol containing at least 6 carbon atoms.

The Adhesion Promoting Composition (Ingredient D)

The characterizing feature of the present organosiloxane compositions is the combination of adhesion promoting and catalyst inhibiting compositions. The adhesion promoting composition consists essentially of a first silane (D1) containing at least one epoxy-substituted group that is bonded to silicon through an alkylene radical, a second silane (D2) containing at least one silicon-bonded alkenyl radical, a liquid adhesion-promoting polyorganosiloxane (D3) containing at least one hydroxyl group, at least one silicon-bonded alkenyl radical, and no more than 15 silicon atoms per molecule and a chelated aluminum compound.

The epoxy-substituted silane (D1) can be represented by the formula $R^1SiR^2_mR^3_{(3-m)}$ and the alkenyl substituted silane by the formula $R^4SiR^5_nR^6_{3-n}$. In these formulae $R^1$ represents an epoxyalkyl radical, $R^4$ represents an alkenyl radical, $R^2$ and $R^5$ are identical or different alkyl radicals, $R^3$ and $R^6$ are identical or different hydrolyzable groups and m and n are individually 0 or 1.

Examples of suitable hydrolyzable groups represented by $R^3$ and $R^6$ include but are not limited to alkoxy, carboxy and ketoximo. In preferred embodiments of ingredients D1 and D2 the hydrolyzable groups are alkoxy groups containing from 1 to 4 carbon atoms and the alkenyl radical is vinyl.

Numerous epoxy-functional silanes are described in U.S. Pat. No. 3,455,877, which is incorporated herein by reference thereto as a disclosure of epoxy-substituted alkoxysilanes that are suitable for use as ingredient D1 of the present compositions.

The epoxy-functional silane is preferably a mono(epoxyorgano)trialkoxysilane wherein the epoxyorgano group is selected from the group consisting of

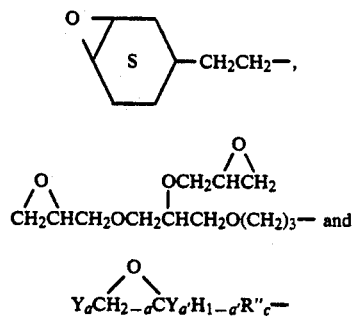

in which each Y represents an alkyl radical containing one or two carbon atoms, a is 0, 1, or 2, c and d are each 0 or 1 and R″ represents a divalent hydrocarbon radical containing no more than 12 carbon atoms, and is either a divalent saturated aliphatic hydrocarbon radical or an arylene radical, or a divalent radical of the formula —R‴ (OR‴)$_b$OR‴—, wherein any two oxygen atoms are separated by at least two carbon atoms, R⁗ is a divalent saturated aliphatic hydrocarbon radical containing from 2 to 6 carbon atoms and the value of b is from 0 to 8, inclusive. Most preferably ingredient D1 is a 3-glycidoxypropyltrialkoxysilane where the alkoxy group is methoxy or ethoxy.

Examples of suitable epoxy-substituted silanes include but are not limited to 3-glycidoxypropyl-trimethoxysilane and 3,4-epoxycyclohexylmethyltrimethoxysilane.

Examples of useful alkenyl-substituted silanes (D2) include but are not limited to vinyltrimethoxysilane, vinyltri(methylethylketoximo)silane, vinyltriethoxysilane, and allytrimethoxysilane. The alkenyl radicals present in this ingredient and ingredient D3 typically contain from 2 to about 8 carbon atoms, with vinyl and allyl being preferred.

To maintain the desired balance between adhesion, cure rate and storage stability of the present curable compositions the concentration of the epoxy-substituted silane (D1) is typically from 0.1 to about 3 weight percent, preferably from 0.5 to 2 weight percent, based on the total weight of the curable composition. The concentration of the alkenyl-substituted silane (D2) is from 0.1 to about 1 weight percent, based on the weight of the composition.

Ingredient D3 of the present compositions is a liquid adhesion-promoting polyorganosiloxane containing an average of fewer than 15 silicon atoms per molecule and at least one each of a silicon-bonded hydroxyl group and a silicon-bonded alkenyl radical. The remaining valences of the silicon atoms in ingredient D3 are satisfied by alkyl radicals containing no more than six carbon atoms, phenyl radicals and oxygen atoms connecting adjacent silicon atoms.

The siloxane units present in ingredient D3 can include $R^7SiO_{1.5}$, $R^7_2SiO$, $R^7_3SiO_{0.5}$, $CH_2=CHSiO_{1.5}$, $C_6H_5SiO_{1.5}$, $HOSiO_{1.5}$, $R(CH_2=CH)SiO$, $R^7(OH)SiO$, $HOR^7_2SiO_{0.5}$, $HO(C_6H_5)SiO$ and $(HO)(C_6H_5)R'SiO_{1.5}$, where $R^7$ represents an alkyl radical containing up to six carbon atoms. Preferably ingredient D3 is a polydiorganosiloxane containing hydroxyl groups only on the terminal units and the diorganosiloxane units are methylvinylsiloxane or a mixture of dimethylsiloxane and methylvinylsiloxane.

Ingredient D3 constitutes from 0.1 to about 3 weight percent of the present curable organosiloxane compositions.

The adhesion promoting component of the present compositions also contains a chelated aluminum compound that promotes a hydrolysis/condensation reaction of the silanes comprising this component. This reaction is believed responsible for development of adhesion during curing of the organosiloxane composition at temperatures no higher than 120° C., preferably no higher than 110° C. The curable composition should contain at least about 0.005 weight percent, based on the weight of the curable composition, of the aluminum compound.

The aluminum compounds useful as catalysts for the adhesion promoting component are derived from chelated organic compounds. The chelating agent can be any organic compound capable of forming at least two coordinate bonds with an aluminum atom, resulting in a cyclic structure. Preferred chelating agents are 1,3-diketones such as acetylacetone.

The concentration of the chelated aluminum compound is typically from 0.005 to about 0.5 weight percent, based on the weight of the curable organosiloxane composition. The use of an excessive amount of aluminum compound does not serve any useful purpose, and may detract from the thermal stability of the cured composition.

The Catalyst Inhibiting Composition (Ingredient E)

The catalyst inhibiting portion of the present compositions is responsible for the combination of excellent storage stability at temperatures of up to 30° C. and the ability of the compositions to cure in 30 minutes or less at temperatures below 120° C.

One of the two required inhibitors, referred to hereinafter as ingredient E1, is a cyclic methylvinylsiloxane oligomer that is preferably present at a concentration of from 0.05 to about 0.5 weight percent, based on the weight of the curable organosiloxane composition. The use of cyclic methylvinylsiloxanes and other olefinically substituted organosiloxanes as platinum catalyst inhibitors is described in U.S. Pat. No. 3,989,667, the relevant sections of which are incorporated by reference into this specification.

The second required platinum catalyst inhibitor is an acetylenic alcohol containing at least 6 carbon atoms, referred to hereinafter as ingredient E2. This alcohol can be primary, secondary or tertiary is preferably a liquid at 25° C. The carbon-to- carbon triple bond that characterizes this ingredient is preferably located at a terminal carbon atom. A preferred inhibitor, based on its commercial availability, is 3,5-dimethyl-1-hexyn-3-ol. The concentration of ingredient E2 is preferably from 0.05 to 1.0 weight percent, based on the weight of the curable composition.

The concentrations of ingredients E1 and E2 that will yield the desired combination of storage stability and curing speed at the selected curing temperature may vary from the preferred ranges depending upon the types and relative concentrations of the alkenyl-containing polydiorganosiloxane and organohydrogensiloxane and the type of platinum-containing hydrosilation catalyst. Excessively high concentrations of the inhibiting compounds will unduly inhibit curing at the selected temperature or may even prevent curing below temperatures sufficient to volatilize the inhibitors.

Embodiments of ingredient E can also include from 0.1 to about 1 weight percent, based on the weight of the curable composition, of benzyl alcohol (ingredient E3). This alcohol imparts additional storage stability of the curable composition, yet is sufficiently volatile that it evaporates rapidly at the temperatures used to cure the composition, allowing relatively rapid curing to occur.

The Alkenyl-Containing Polydiorganosiloxane (Ingredient A)

The polyorganosiloxane referred to as ingredient A of the present compositions is the principal ingredient of these compositions. This ingredient must contain at least two silicon-bonded alkenyl radicals in each molecule. Suitable alkenyl radicals contain from 1 to about 10 carbon atoms and are exemplified by but not limited to vinyl, allyl and 5-hexenyl. The silicon-bonded organic groups other than alkenyl radicals present in ingredient A are typically monovalent hydrocarbon and halogenated hydrocarbon radicals exemplified by but not limited to alkyl radicals such as methyl, ethyl and propyl; aryl radicals such as phenyl; and halogenated alkyl radicals such as 3,3,3-trifluoropropyl.

The molecular structure of ingredient A is typically linear, however there can be some branching due to the presence of trivalent siloxane units within the molecule. To achieve a useful level of tensile properties in the elastomers prepared by curing the present compositions, the molecular weight of this ingredient should be sufficient to achieve a viscosity at 25° C. greater than about 0.1 Pa.s. The upper limit for the molecular weight of ingredient A is not specifically restricted, and is typically limited only by the processability of the curable organosiloxane composition. The polyorganosiloxanes range from pourable liquids to gum type polymers that are typically characterized by Williams plasticity values.

Preferred embodiments of ingredient A can be represented by the general formula I

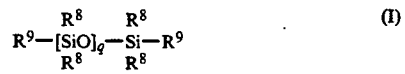

where $R^8$ is individually selected from monovalent hydrocarbon radials and monovalent halohydrocarbon radicals, $R^9$ represents a vinyl or other alkenyl radical, and q represents a degree of polymerization equivalent to a viscosity of at least 1000 centipoise (1 Pa.s).

The two $R^8$ substituents on each silicon atom can be identical or different, and can contain from 1 to about 20 carbon atoms. A range of from 1 to 10 carbon atoms is preferred based on the availability of the corresponding monomers. Most preferably at least one of the hydrocarbon radicals on each silicon atom is methyl, and any remainder are vinyl, phenyl and/or 3,3,3-trifluoropropyl, this preference being based on the availability of the reactants typically used to prepare the polydiorganosiloxane and the properties of cured elastomers prepared from these polydiorganosiloxanes.

Representative embodiments of ingredient A containing ethylenically unsaturated hydrocarbon radicals only at the terminal positions include but are not limited to dimethylvinylsiloxy-terminated polydimethylsiloxanes, dimethylvinylsiloxy-terminated-polymethyl-3,3,3-trifluoropropylsiloxanes, dimethylvinylsiloxy-terminated-dimethylsiloxane/3,3,3-trifluoropropylmethylsiloxane copolymers and dimethylvinylsiloxy-terminated-dimethylsiloxane/methylphenylsiloxane copolymers.

Methods for preparing ingredient A of the present compositions by hydrolysis and condensation of the corresponding halosilanes or by condensation of the cyclic polydiorganosiloxanes are sufficiently disclosed in the patent and other literature that a detailed description in this specification is not necessary.

For applications requiring high levels of physical properties such as tear strength it may be desirable to include in the curable organosiloxane composition a second polydiorganosiloxane containing ethylenically unsaturated hydrocarbon radicals bonded to both terminal and non-terminal silicon atoms.

The Organohydrogensiloxane (Ingredient B)

The curable organosiloxane compositions of this invention contain at least one organohydrogensiloxane functions as a crosslinker for ingredient A. In the presence of the hydrosilation catalyst, referred to as ingredient C, the silicon-bonded hydrogen atoms in ingredient B undergo an addition reaction, referred to as hydrosilation, with the silicon-bonded alkenyl groups in ingredient A, resulting in crosslinking and curing of the composition.

Ingredient B must contain at least 2 silicon-bonded hydrogen atoms in each molecule. If ingredient A contains only two alkenyl radicals per molecule, ingredient B must contain an average of more than two silicon-bonded hydrogen atoms to achieve a crosslinked structure in the final cured product. The silicon-bonded organic groups present in ingredient B are selected from the same group of monovalent hydrocarbon and halogenated hydrocarbon radicals as the organic groups of ingredient A, with the proviso that the organic groups in ingredient B must be substantially free of ethylenic or acetylenic unsaturation. The molecular structure of ingredient B can be straight chain, branch- containing straight chain, cyclic, or network.

While the molecular weight of ingredient B is not specifically restricted, viscosities in the range of 3 to 10,000 centipoise at 25 degrees Centigrade are preferred.

The concentration of ingredient B is sufficient to provide a molar ratio of silicon-bonded hydrogen atoms to alkenyl radicals in the curable composition of from 0.5 to 20. A range of from 1 to 3 is preferred.

When the curable composition contains less than 0.5 moles of silicon-bonded hydrogen atoms per mole of alkenyl radicals the composition cannot be satisfactorily cured. Bubble formation resulting from the generation of hydrogen gas can occur when the composition contains more than about 20 silicon-bonded hydrogen atoms per alkenyl radical.

The Platinum-Containing Hydrosilation Reaction Catalyst (Ingredient C)

Curing of the present compositions is catalyzed by a hydrosilation catalyst that is a metal from the platinum group of the periodic table or a compound of such a metal. These metals include platinum, palladium and rhodium. Platinum and platinum compounds are preferred based on the high activity level of these catalysts in hydrosilation reactions.

Examples of preferred curing catalysts include but are not limited to platinum black, platinum metal on various solid supports, chloroplatinic acid, alcohol solutions of chloroplatinic acid, and complexes of chloroplatinic acid with liquid ethylenically unsaturated compounds such as olefins and organosiloxanes containing ethylenically unsaturated hydrocarbon radicals bonded to silicon. Complexes of chloroplatinic acid with the aforementioned organosiloxanes containing ethylenically unsaturated hydrocarbon radicals are described in U.S. Pat. No. 3,419,593, which issued to David N. Willing on Dec. 31, 1968. The relevant portions of this patent are incorporated herein by reference as a teaching of preferred catalysts.

The concentration of ingredient C in the present compositions is equivalent to a platinum concentration of from 0.1 to 500 parts by weight of platinum metal, preferably from 1 to 50 parts by weight of platinum metal, per million parts (ppm), based on the combined weight of ingredients A and B.

Curing does not proceed satisfactorily at below 0.1 ppm of platinum, while using more than 500 ppm results in no appreciable increase in cure rate, and is therefore uneconomical.

Optional Ingredients

The Silica Filler

To achieve high levels of tear strength and other physical properties that characterize some types of cured elastomers that can be prepared using the compositions of this invention, it may be desirable to include a reinforcing silica filler. This filler is usually treated with any of the known silica treating agents to prevent a phenomenon referred to as "creping" or "crepe hardening" during processing of the curable composition.

Any finely divided form of silica can be used as the reinforcing filler. Colloidal silicas are preferred because of their relatively high surface area, which is typically at least 50 square meters per gram. Fillers having surface areas of at least 300 square meters per gram are preferred for use in the present method. Colloidal silicas can be of the precipitated or a fume type. Both of these preferred types of silica are commercially available.

The amount of finely divided silica used in the present compositions is at least in part determined by the physical properties desired in the cured elastomer. Liquid or pumpable polyorganosiloxane compositions typically contain from about 10 to about 60 percent by weight of silica, based on the weight of polydiorganosiloxane. This value is preferably from about 30 to about 50 percent.

The silica treating agent can be any of the low molecular weight organosilicon compounds disclosed in the art as being suitable for preventing creping of organosiloxane compositions during processing. The treating agents are typically liquid hydroxyl terminated polydiorganosiloxanes containing an average of from 2 to about 20 repeating units per molecule, and organosilicon compounds such as hexaorganodisiloxanes and hexaorganodisilazanes that hydrolyze under the conditions used to treat the silica to form compounds with silicon-bonded hydroxyl groups. Preferably at least a portion of the silicon bonded hydrocarbon radicals present on the treating agent are identical to a majority of the hydrocarbon radicals present in ingredients A and B. A small amount of water can be added together with the silica treating agent(s) as a processing aid.

It is believed that the treating agents function by reacting with silicon-bonded hydroxyl groups present on the surface of the silica particles to reduce interaction between these particles.

When a silica filler is present, it is preferably treated in the presence of at least a portion of the other ingredients of the present compositions by blending these ingredients together until the filler is completely treated and uniformly dispersed to form a homogeneous material.

The ingredients that are present during treatment of the silica typically include the silica treating agents and at least a portion of the polydiorganosiloxane(s) referred to herein as ingredient A.

The organosiloxane compositions of this invention can contain one or more additives that are conventionally present in curable compositions of this type to impart or enhance certain physical properties of the cured elastomer or facilitate processing of the curable composition.

Typical additives include but are not limited to pigments, dyes, adhesion promoters, flame retardants, and heat and/or ultraviolet light stabilizers. Resinous organosiloxane copolymers can be added as a reinforcing agent to improve the physical properties of the cured elastomer.

A preferred type of resinous copolymer contains repeating units of the general formula $SiO_{4/2}$ in addition to triorganosiloxy units of the general formulae $R^{10}{}_3SiO_{1/2}$ and diorganovinylsiloxy units of the general formula $CH_2=CH(R^{11})_2SiO_{1/2}$. In these formulae $R^{10}$ and $R^{11}$ are individually monovalent hydrocarbon or substituted monovalent hydrocarbon radicals as previously defined for the $R^8$ radicals of ingredient A.

The molar ratio of the combination of triorganosiloxy units and diorganovinylsiloxy units to $SiO_{4/2}$ units in the resinous copolymer is from 0.7 to 1.2, inclusive. The vinyl-containing units constitute from 2 to 8 percent by weight of the copolymer, which preferably contains at least two vinyl radicals per molecule. In preferred embodiments of the copolymer the ranges for the molar ratio of diorganovinylsiloxy:triorganosiloxy:$SiO_{4/2}$ units is 0.08–0.1:0.06–1:1.

The resinous copolymers can be prepared as described in U.S. Pat. No. 2,676,182, which issued to Daudt and Tyler on Apr. 20, 1954 and is hereby incorporated in this specification by reference thereto. The copolymers described in this patent contain from 2 to 23 percent by weight of hydroxyl groups, which is considerably above the maximum level of about 0.8 weight percent preferred for precursors of the present copolymers. The hydroxyl content of the precursor can be conveniently reduced to the desired level by employing a higher concentration of triorganosiloxane units than the concentration range taught by Daudt et al.

Briefly, the method of Daudt et al. comprises reacting a silica hydrosol under acidic conditions with the appropriate amount of hexamethyldisiloxane or trimethylchlorosilane. The resinous copolymers used to prepare the present elastomers can be obtained by reacting Daudt et al's. product with the required amount of a hexaorganodisilazane or a hexaorganodisiloxane wherein each silicon atom contains a vinyl radical and two methyl or other hydrocarbon radicals represented by $R^1$ and $R^2$ in the foregoing formula.

Preparation of Curable Compositions

The one-part compositions of this invention can be prepared by combining all of ingredients at ambient temperature. Any of the mixing techniques and devices described in the prior art can be used for this purpose. The particular device used will be determined by the viscosity of the ingredients and the final curable composition. Cooling of the ingredients during mixing may be desirable to avoid premature curing.

To maximize storage stability the curable compositions are preferably kept in closed containers until used.

If it is desired to store the present compositions for a longer period of time than can be achieved using the present inhibitor compositions, referred to hereinbefore as ingredient E, this can be achieved by packaging the ingredients of the compositions in two or more containers, with the hydrosilation catalyst and the organohydrogensiloxane in separate containers.

Depending upon the types and concentrations of ingredients A and B, cured organosiloxane materials prepared using the present compositions can vary in properties from brittle resins to elastomers, and are useful in a variety of end-use applications as coatings or as molded or extruded articles. Unfilled materials are particularly useful as protective coatings, encapsulants and potting compositions for protecting delicate electronic devices such as transistors and integrated circuits from damage by moisture and other materials present in the environment that can adversely affect operation of the device. The compositions can be used to coat either the individual devices or a circuit board containing a number of these devices together with other electronic components.

Depending upon their viscosity the compositions can be applied to substrates by spraying, dipping or by the use of a brush, roller or coating bar. If required the viscosity of the compositions can be reduced using suitable organic solvents or reactive diluents.

EXAMPLES

The following examples describes preferred one-part curable compositions of the present invention and should not be interpreted as limiting the scope of the invention defined in the accompanying claims. Unless otherwise specified all parts and percentages in the example are by weight and viscosities were measured at 25 C.

EXAMPLE 1

This example demonstrates the unique properties of the present compositions and compares them with the properties of compositions that lack at least one of the adhesion promoting and/or catalyst inhibiting ingredients.

A curable composition of this invention was prepared by blending the following ingredients to homogeneity.

as ingredient A, 73 parts of a dimethylvinylsiloxy-terminated polydimethylsiloxane having a viscosity of about 0.4 Pa.s at 25° C. and 8.2 parts of a dimethylvinylsiloxy-terminated polydimethylsiloxane having a viscosity of about 3 Pa.s at 25° C.;

as a reinforcing agent, 1.8 parts of a resinous benzene-soluble copolymer containing triorganosiloxy units and $SiO_2$ units in the mol ratio of about 0.7 mol of triorganosiloxy unit per mol of $SiO_2$ units, where the triorganosiloxy units are trimethylsiloxy and dimethylvinylsiloxy, and the copolymer contains from 1.4 to 2.2 weight percent of silicon-bonded vinyl radicals;

as the hydrosilation catalyst, 0.3 part of a reaction product of hexachloroplatinic acid and sym-tetramethyldivinyldisiloxane that has been diluted with a liquid dimethylvinylsiloxy terminated polydimethylsiloxane in an amount sufficient to achieve a platinum content of 0.7 weight percent;

as the catalyst inhibiting composition, 0.29 part of cyclic methylvinylsiloxanes as ingredient E1, 0.3 part of 3,5-dimethyl-1-hexyn-3-ol as ingredient E2, and 0.3 part of benzyl alcohol as ingredient E3 ; and as the adhesion promoter composition, 0.2 part of vinyltrimethoxysilane as ingredient D1, 0.9 part of glycidoxypropyltrimethoxysilane as ingredient D2, 0.9 part of a hydroxyl-terminated polymethylvinylsiloxane containing about 4 weight percent of silicon-bonded hydroxyl groups as ingredient D3, and 0.01 part of aluminum acetylacetonate.

The storage stability of the composition was determined by storing the compositions in a closed container under ambient conditions. The composition was examined at weekly intervals during the first two months and at monthly intervals thereafter to determine whether the curing had occurred, as evidenced by an increase in the viscosity of the composition. No appreciable increase in viscosity was apparent following four months of storage.

The cure times of the initial composition at 85° and 110° C. were determined using sheets of stainless steel and aluminum and an FR-4 type of printed circuit board containing a number of electronic components soldered to the board. The substrates were dipped into the curable composition and a sheet of aluminum foil was applied to the one surface of the metal sheets and the surface of the FR-4 board that did not contain the electronic components. The coatings were cured by placing the coated substrates in an oven. The coatings were considered cured when they were dry to the touch. The coating required 30 minutes to cure at 85° C. and 5-10 minutes at 110° C.

A sample of the composition was stored under ambient conditions for three months with no noticeable adverse effects on cure time or adhesion.

The type of adhesion of the cured coatings to each of the substrates was determined by lifting a portion of the aluminum foil from the substrate using a knife blade, grasping the loose edge of the foil and the substrate in the jaws of a tensile tester and exerting sufficient force to peel the remaining foil from the substrate at an angle of 180 degrees. Cured material adhered to the entire surface of all three substrates following removal of the foil.

For purposes of comparison a curable composition described in example 1 of U.S. Pat. No. 5,082,894 was prepared and coated onto stainless steel, aluminum and an FR-4 board as described in the preceding portion of this example. The curable composition contained the following ingredients.

92 parts of a dimethylvinylsiloxy-terminated polydimethylsiloxane having a viscosity of 0.4 Pa.s, 6 parts of a trimethylsiloxy-terminated polydiorganosiloxane having an average of five methylhydrogensiloxane units and three dimethylsiloxane units per molecule and containing from 0.7 to 0.8 weight percent of silicon-bonded hydrogen atoms, 0.3 or 0.2 part of a reaction product of hexachloroplatinic acid and sym-tetramethyldivinyldisiloxane that has been diluted with a liquid dimethylvinylsiloxy terminated polydimethylsiloxane in an amount sufficient to achieve a platinum content of 0.7 weight percent, as the adhesion promoter, 1.0, 1.2 or 1.5 part of a 1:1 weight ratio mixture of a hydroxyl terminated polymethylvinylsiloxane having about 4 weight percent of hydroxyl groups (ingredient D3 of the present compositions) and gamma-glycidoxypropyltrimethoxysilane (ingredient D2 of the present compositions), and as the platinum catalyst inhibitor 0.5 part of 3,5-dimethyl-1 hexyn-3-ol, ingredient E2 of the present invention.

The composition cured in 10 minutes at 105° C. but did not cure at 85° C. even after 30 minutes, the commercially useful maximum cure time. The cured composition exhibited cohesive failure on the FR-4 board but could be pulled from the aluminum and stainless steel panels without any coating remaining on the metal.

The comparative example demonstrates that the ability of the compositions to cure at 85° C. and adhere to metal substrates is absent when a cyclic methylvinylsiloxane (ingredient E1), benzyl alcohol (ingredient E3) and an alkenyltrialkoxysilane (ingredient D1) were omitted from the curable composition.

EXAMPLE 2

This example demonstrates the effect on adhesion and storage stability of omitting each of the adhesion-promoting and catalyst-inhibiting ingredients of the present compositions individually. Seven curable organosiloxane compositions were prepared and evaluated as described in Example 1 of this specification using the same types and amounts of ingredients. Six of the seven composition omitted one of the adhesion-promoting or catalyst-inhibiting ingredients present in the compositions of Example 1, and the seventh composition contained all of these ingredients. The ingredients D1, D2, D3, E1 and E2 present (+) and absent (−) in each of the composition are summarized in Table 1. The storage stability at 25° C., curing time at 85° C. and adhesion of these compositions are summarized in Table 2.

TABLE 1

| Composition | D1 | D2 | D3 | E1 | E2 | AlAcAc |
|---|---|---|---|---|---|---|
| 1 | − | + | + | + | + | + |
| 2 | + | + | − | + | + | + |
| 3 | + | − | + | + | + | + |
| 4 | + | + | + | − | + | + |
| 5 | + | + | + | + | − | + |
| 6 | + | + | + | + | + | − |
| 7 (Invention) | + | + | + | + | + | + |

AlAcAc = Aluminum Acetylacetonate

TABLE 2

| Composition | Storage Stability | Cure Time @ 85° C. | Adhesion |
|---|---|---|---|
| 1 | Good | >30 minutes | Poor |
| 2 | Fair | <30 minutes | Fair |
| 3 | Poor | <30 minutes | Fair |
| 4 | * | * | Fair |
| 5 | None** | <<30 minutes | Good |
| 6 | Good | <30 minutes | Fair |
| 7 | Good | <30 minutes | Excellent |

* = Cure time increased with storage at 25° C.
** = Composition began curing shortly after being prepared That which is claimed is:

1. A storage stable organosiloxane composition exhibiting adhesion to both organic and inorganic substrates following curing at temperatures below 110° C., said composition comprising (A) a curable polyorganosiloxane containing at least two alkenyl radicals and no hydroxyl groups per molecule, (B) an amount sufficient to cure said composition of an organohydrogensiloxane containing at least two silicon-bonded hydrogen atoms per molecule, where the sum of the alkenyl radicals per molecule of (A) and the silicon-bonded hydrogen atoms per molecule of (B) is greater than 4, (C) an amount sufficient to promote curing of said composition of a hydrosilation catalyst selected from the group consisting of metals from the platinum group of the periodic table and compounds of these metals, (D) an amount sufficient to achieve adhesion to substrates in contact with said composition during curing of an adhesion promoting composition consisting essentially of an epoxy-substituted silane, an alkenyl-substituted silane, an adhesion-promoting polyorganosiloxane that is a liquid at 25° C. and contains at least one silicon-bonded hydroxyl group, at least one alkenyl radical and not more than 15 silicon atoms per molecule, and an amount of a chelated aluminum compound sufficient to promote reaction of said adhesion promoting composition during curing of said organosiloxane composition, where said epoxy- and alkenyl-substituted silanes contain at least two silicon-bonded hydrolyzable groups per molecule, and (E) an amount sufficient to inhibit curing of said composition under ambient conditions of a catalyst inhibiting composition comprising at least one cyclic methylvinylsiloxane and an acetylenic alcohol containing at least 6 carbon atoms.

2. A organosiloxane composition according to claim 1 where said epoxy-substituted silane exhibits the formula $R^1SIR^2{}_n(R^3)_{3-n}$, said alkenyl-substituted silane exhibits the formula $R^4SiR^5{}_n(R^6)_{3-n}$, where $R^1$ represents an epoxyalkyl radical, $R^4$ represents an alkenyl radical, $R^2$ and $R^5$ are identical or different alkyl radicals, $R^3$ and $R^6$ are individually selected from the group consisting of alkoxy, carboxy, and ketoximo, n is 0 or 1, the siloxane units of said adhesion-promoting polyorganosiloxane are selected from the group consisting of $R'SiO_{1.5}$, $R'_2SiO$, $R'_3SiO_{0.5}$, $CH_2=CHSiO_{1.5}$, $C_6H_5SiO_{1.5}$, $HOSiO_{1.5}$, $R'(CH_2=CH)SiO$, $R'(OH)SiO$, $HO(C_6H_5)SiO$ and $(HO)(C_6H_5)R'SiO_{0.5}$ where R' represents an alkyl radical containing up to six carbon atoms.

3. A composition according to claim 2 where said curable polyorganosiloxane is represented by the formula

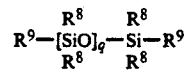

where each $R^8$ is individually selected from the group consisting of monovalent hydrocarbon radicals and monovalent halohydrocarbon radicals, $R^9$ represents an alkenyl radical and q represents a degree of polymerization equivalent to a viscosity of at least 1000 centipoise (1 Pa.s), $R^2$ and $R^5$ are methyl, the molar ratio of silicon-bonded hydrogen atoms to alkenyl radicals in said composition is from 0.5 to 20, the concentration of said hydrosilation catalyst is equivalent to from 0.1 to 500 parts by weight of platinum per million parts by weight of said composition, $R^1$ is 3-glycidoxypropyl or 3,4-epoxycyclohexylmethyl, $R^3$ and $R^6$ are alkoxy groups, $R^4$ is vinyl or allyl, said alkenyl substituted silane constitutes from 0.1 to 1 weight percent of said composition, said epoxy-substituted silane constitute from 0.1 to 3 weight percent of said composition, said second liquid polyorganosiloxane constitutes from 0.1 to 3 weight percent of said composition, said aluminum compound is aluminum acetylacetonate and constitutes from 0.05 to 1 weight percent of said composition, and said acetylenic alcohol contains 8 carbon atoms, said cyclic methylvinylsiloxane constitutes from 0.05 to 5 weight percent of said composition, said acetylenic alcohol constitutes from 0.5 to 1 weight percent of said curable composition, said catalyst inhibiting composition further comprises benzyl alcohol and said curable composition contains a reinforcing agent selected from the group consisting of silica and resinous copolymers containing repeating units of the general formula $SiO_{4/2}$ in addition to triorganosiloxy units of the general formulae $R^9{}_3SiO_{1/2}$ and diorganovinylsiloxy units of the general formula $CH_2=CH(R^{10})_2SiO_{1/2}$, where $R^9$ and $R^{10}$ are individually monovalent hydrocarbon or substituted monovalent hydrocarbon radicals selected from the same group as $R^7$.

4. A composition according to claim 3 where $R^3$ and $R^6$ are methoxy, n=0, the concentration of said epoxy substituted silane is from 0.5 to 2 weight percent, based on the weight of said composition, the siloxane units of said second liquid polyorganosiloxane are dimethylsiloxane or a mixture of dimethylsiloxane and methylvinylsiloxane, at least one of the hydrocarbon radicals represented by $R^7$ is methyl and any remainder are phenyl or 3,3,3-trifluoropropyl, and the molar ratio of silicon-bonded hydrogen atoms to alkenyl radicals in said composition is from 1 to 3.

5. A composition according to claim 1 where the ingredients of the composition are packaged in two or more containers where the hydrosilation catalyst and the organohydrogensiloxane are located in separate containers.

* * * * *